USO11264217B2

(12) United States Patent
Yahata (10) Patent No.: US 11,264,217 B2
(45) Date of Patent: Mar. 1, 2022

(54) SUBSTRATE PROCESSING APPARATUS

(71) Applicant: KOKUSAI ELECTRIC CORPORATION, Tokyo (JP)

(72) Inventor: Takashi Yahata, Toyama (JP)

(73) Assignee: KOKUSAI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 16/942,135

(22) Filed: Jul. 29, 2020

(65) Prior Publication Data

US 2021/0035784 A1 Feb. 4, 2021

(30) Foreign Application Priority Data

Jul. 30, 2019 (JP) .............................. JP2019-139907

(51) Int. Cl.
*H01J 37/32* (2006.01)

(52) U.S. Cl.
CPC ...... *H01J 37/32733* (2013.01); *H01J 37/321* (2013.01); *H01J 37/32568* (2013.01); *H01J 37/32715* (2013.01)

(58) Field of Classification Search
CPC ........... H01J 37/32733; H01J 37/32715; H01J 37/32568; H01J 37/321
See application file for complete search history.

(56) References Cited

U.S. PATENT DOCUMENTS

| 6,456,010 | B2 | 9/2002 | Yamakoshi et al. | |
| 2014/0000810 | A1* | 1/2014 | Franklin | H01L 21/306 156/345.48 |
| 2016/0056035 | A1 | 2/2016 | Toyoda et al. | |
| 2016/0307743 | A1* | 10/2016 | Brown | H01J 37/32183 |
| 2016/0322215 | A1* | 11/2016 | Shaikh | H01J 37/32568 |
| 2017/0076921 | A1* | 3/2017 | Sakiyama | C23C 16/45544 |
| 2018/0090502 | A1* | 3/2018 | Shimamoto | H01L 27/10876 |
| 2019/0032217 | A1* | 1/2019 | Yoshino | H05H 1/46 |
| 2019/0385907 | A1* | 12/2019 | Gottheim | H01J 37/32183 |
| 2020/0173022 | A1* | 6/2020 | Han | H01J 37/32449 |

FOREIGN PATENT DOCUMENTS

| JP | 2002-316892 A | 10/2002 | |
| JP | 2002316892 A | * 10/2002 | ............ C30B 25/14 |
| JP | 2014-075579 A | 4/2014 | |
| KR | 10-0449370 B | 9/2004 | |
| KR | 10-2016-0024713 A | 3/2016 | |
| KR | 10-2018-0118693 A | 10/2018 | |
| WO | 2017/183401 A1 | 10/2017 | |
| WO | WO-2017183401 A1 | * 10/2017 | ......... C23C 16/4583 |

OTHER PUBLICATIONS

Japanese Office Action dated Jan. 19, 2021 for Japanese Patent Application No. 2019-139907.
Korean Office Action dated Jan. 10, 2022 for Korean Patent Application No. 10-2020-0094213.

* cited by examiner

*Primary Examiner* — Renan Luque
(74) *Attorney, Agent, or Firm* — Volpe Koenig (57) ABSTRACT

There is provided a technique that include: a process chamber including a plasma generation space and a process space; a coil electrode arranged around the plasma generation space; a substrate mounting table on which a substrate to be processed in the process space is mounted; an elevator configured to move the substrate mounting table in the process chamber; and a controller configured to control the elevator to vary a distance between the substrate and an end portion of the coil electrode according to process distribution information on the substrate.

16 Claims, 6 Drawing Sheets

SUBSTRATE PROCESSING APPARATUS

CROSS-REFERENCE TO RELATED APPLICATION

This application is based upon and claims the benefit of priority from Japanese Patent Application No. 2019-139907, filed on Jul. 30, 2019, the entire contents of which are incorporated herein by reference.

TECHNICAL FIELD

The present disclosure relates to a substrate processing apparatus.

BACKGROUND

In recent years, semiconductor devices have tended to be highly integrated, and the pattern size thereof has been remarkably miniaturized accordingly. The miniaturized pattern is formed through various steps such as a step of forming a hard mask, a resist layer or the like, a photolithography step, an etching step and the like. For example, in the related art, as one step of a manufacturing process of a semiconductor device having a fine pattern, there is disclosed a technique that performs a predetermined process (for example, an oxidation process) on a surface of a pattern formed on a substrate using plasma generated in a plasma generation space.

SUMMARY

Some embodiments of the present disclosure provide a technique capable of optimizing substrate processing performed using plasma generated in a plasma generation space.

According to an embodiment of the present disclosure, there is provided a techniques that includes: a process chamber including a plasma generation space and a process space; a coil electrode arranged around the plasma generation space; a substrate mounting table on which a substrate to be processed in the process space is mounted; an elevator configured to move the substrate mounting table in the process chamber; and a controller configured to control the elevator to vary a distance between the substrate and an end portion of the coil electrode according to process distribution information on the substrate.

DETAILED DESCRIPTION

Embodiments

Embodiments of the present disclosure will be now described with reference to the drawings.

A substrate processing apparatus exemplified in the following embodiment is used in a semiconductor device manufacturing process, and is configured to perform a predetermined process on a substrate to be processed. An example of the substrate to be processed may include a semiconductor wafer substrate (hereinafter simply referred to as a "wafer") in which a semiconductor integrated circuit device (semiconductor device) is built. When the term "wafer" is used in the present disclosure, it may refer to "a wafer itself" or "a laminated body (aggregate) of a wafer and certain layers or films formed on a surface of the wafer (that is, a wafer including certain layers or films formed on the surface)." When the phrase "a surface of a wafer" is used in the present disclosure, it may refer to "a surface (exposed surface) of a wafer itself" or "a surface of certain layers or films formed on a wafer, that is, the outermost surface of the wafer as a laminated body". When the term "substrate" is used in the present disclosure, it may be synonymous with the term "wafer." Further, a process performed on a wafer includes, for example, an oxidation process, a diffusion process, a reflow and annealing for carrier activation and flattening after ion implantation, a film-forming process, etc. In the present embodiment, specifically, a case where a film on a wafer surface is modified (oxidized) is taken as an example.

(1) Configuration of Substrate Processing Apparatus

Figure 1:
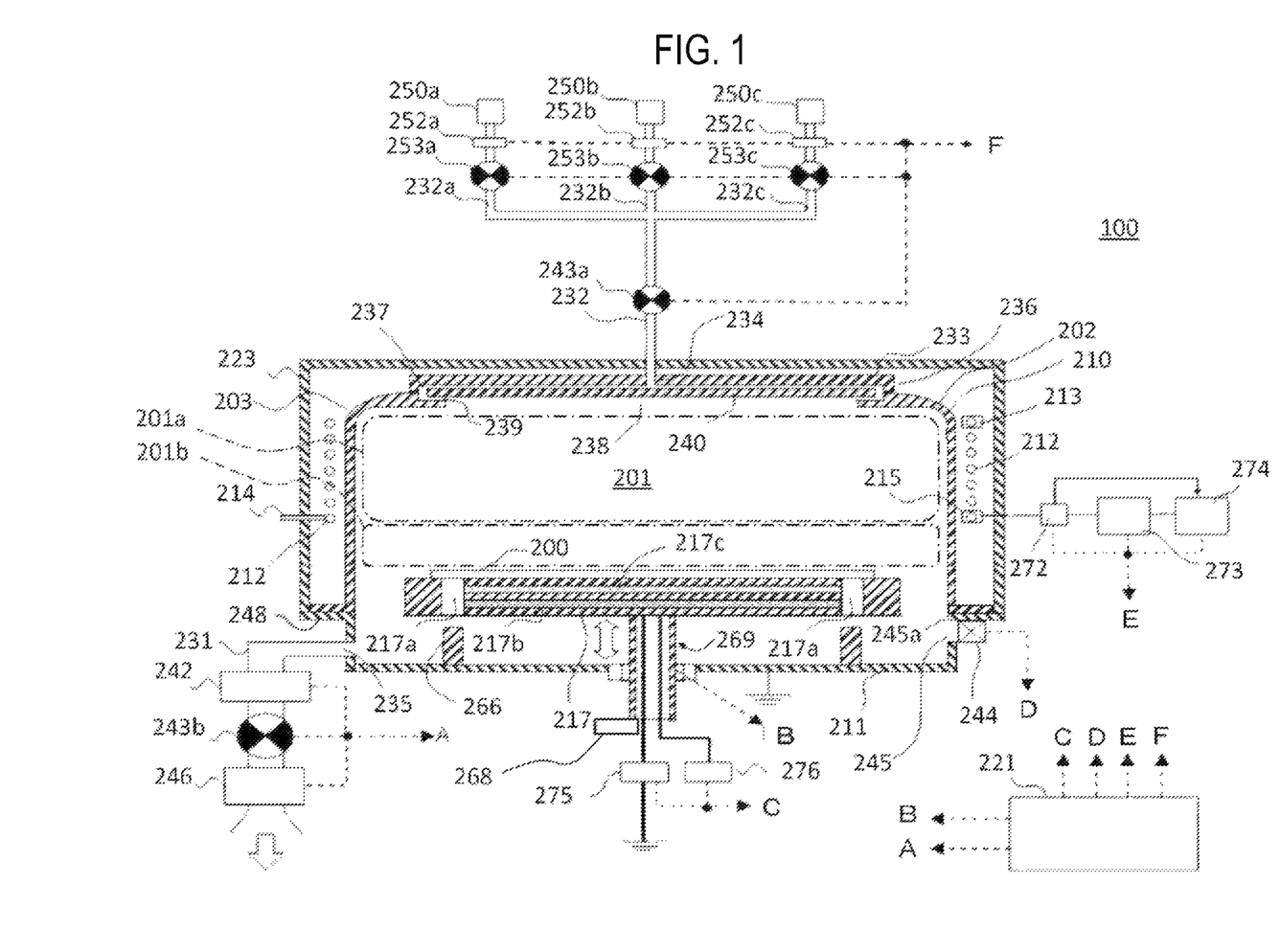
FIG. 1 is a schematic configuration view of a substrate processing apparatus according to an embodiment of the present disclosure.

First, a schematic configuration example of the substrate processing apparatus according to the present embodiment will be described with reference to FIG. 1. FIG. 1 is a schematic configuration view of the substrate processing apparatus according to the present embodiment.

(Process Chamber)

The substrate processing apparatus (hereinafter simply referred to as a "processing apparatus") 100 according to the present embodiment includes a process furnace 202 where a plasma treatment is performed on a wafer 200. The process furnace 202 is provided with a process container 203 that constitutes a process chamber 201. The process container 203 includes a dome-shaped upper container 210 that is a first container, and a bowl-shaped lower container 211 that is a second container. The process chamber 201 is formed by covering the lower container 211 with the upper container 210. The upper container 210 is made of a nonmetallic material such as aluminum oxide ($Al_2O_3$) or quartz ($SiO_2$). The lower container 211 is formed of, for example, aluminum (Al).

A gate valve 244 is installed on a lower side wall of the lower container 211. When the gate valve 244 is opened, the wafer 200 can be loaded into or unloaded from the process chamber 201 through a loading/unloading port 245 using a transport mechanism (not shown). When the gate valve 244 is closed, the process chamber 201 can be kept airtight.

The process chamber 201 includes a plasma generation space 201a around which a coil electrode (hereinafter also simply referred to as a "coil") 212 is installed, and a substrate process space 201b communicating with the plasma generation space 201*a*. The plasma generation space 201*a* is a space in which plasma is generated, and refers to a space above a lower end of the coil 212 and below an upper end of the coil 212 in an internal space of the process chamber 201. On the other hand, the substrate process space 201*b* is a space in which the substrate is processed using plasma, and refers to a space below the lower end of the coil 212. In this embodiment, the plasma generation space 201*a* and the substrate process space 201*b* are configured to have substantially the same horizontal diameter.

(Susceptor)

A susceptor 217 serving as a substrate mounting table on which the wafer 200 is mounted is disposed at the center of a bottom of the process chamber 201. The susceptor 217 is made of, for example, a nonmetallic material such as aluminum nitride (AlN), ceramics, quartz or the like, and is configured to reduce metal contamination on a film or the like formed on the wafer 200.

A heater 217*b* serving as a heating mechanism is integrally embedded in the susceptor 217. When power is supplied to the heater 217*b*, the heater 217*b* is configured to be capable of heating the surface of the wafer 200, for example, from about 25 degrees C. to about 750 degrees C.

The susceptor 217 is electrically isolated from the lower container 211. An impedance adjustment electrode 217*c* is installed inside the susceptor 217 to further improve uniformity of a density of plasma generated on the wafer 200 mounted on the susceptor 217, and is grounded via a variable impedance mechanism 275 serving as an impedance adjustment part. The variable impedance mechanism 275 includes a coil and a variable capacitor, and is configured to control inductance and resistance of the coil and capacitance of the variable capacitor such that an impedance can be changed within a range from about 0Ω to the parasitic impedance of the process chamber 201. Thus, a potential (bias voltage) of the wafer 200 can be controlled via the impedance adjustment electrode 217*c* and the susceptor 217. In the present embodiment, since the uniformity of the density of the plasma generated on the wafer 200 can be improved as described later, when the uniformity of the density of the plasma falls within a desired range, bias voltage control using the impedance adjustment electrode 217*c* is not performed. When the bias voltage control is not performed, the electrode 217*c* may not be installed on the susceptor 217. However, the bias voltage control may be performed for the purpose of further improving the uniformity.

The substrate mounting table according to the present embodiment mainly includes the susceptor 217, the heater 217*b* and the impedance adjustment electrode 217*c*.

In addition, the susceptor 217 is supported by a shaft 269 from below. The shaft 269 penetrates a bottom surface of the lower container 211 while maintaining the airtightness inside the process chamber 201, and is connected to a susceptor elevating mechanism 268 outside the process chamber 201. The susceptor elevating mechanism 268 includes a drive source (not shown) such as an electric motor that operates according to an instruction from a controller 221 to be described later, and is configured to move the shaft 269 and the susceptor 217 supported by the shaft 269 in a vertical direction when the drive source operates. That is, the susceptor elevating mechanism 268 functions as a movement mechanism part or an elevating part (or an elevator) that moves (elevates) the susceptor 217 up or down in the process chamber 201.

Further, through-holes 217*a* are formed in the susceptor 217, and wafer push-up pins 266 are installed at the bottom surface of the lower container 211. At least three through-holes 217*a* and at least three wafer push-up pins 266 are provided at positions where they face each other. When the susceptor 217 is lowered by the susceptor elevating mechanism 268, the wafer push-up pins 266 are configured to penetrate through the through-holes 217*a* in a state where the wafer push-up pins 266 are not in contact with the susceptor 217.

(Gas Supply Part)

A gas supply head 236 is installed above the process chamber 201, that is, at an upper portion of the upper container 210. The gas supply head 236 includes a cap-like lid 233, a gas inlet 234, a buffer chamber 237, an opening 238, a shielding plate 240, and a gas outlet 239 and is configured to be capable of supplying a reaction gas into the process chamber 201. The buffer chamber 237 has a function as a dispersion space that disperses the reaction gas introduced from the gas inlet 234.

A downstream end of an oxygen-containing gas supply pipe 232*a* configured to supply an oxygen ($O_2$) gas as an oxygen-containing gas, a downstream end of a hydrogen-containing gas supply pipe 232*b* configured to supply a hydrogen ($H_2$) gas as a hydrogen-containing gas, and a downstream end of an inert gas supply pipe 232*c* configured to supply an argon (Ar) gas as an inert gas are connected to join the gas inlet 234. An $O_2$ gas supply source 250*a*, a mass flow controller (MFC) 252*a* as a flow rate control device, and a valve 253*a* as an opening/closing valve are installed at the oxygen-containing gas supply pipe 232*a* in sequence from the upstream side. An $H_2$ gas supply source 250*b*, an MFC 252*b*, and a valve 253*b* are installed at the hydrogen-containing gas supply pipe 232*b* in sequence from the upstream side. An Ar gas supply source 250*c*, an MFC 252*c*, and a valve 253*c* are installed at the inert gas supply pipe 232*c* in sequence from the upstream side. A valve 243*a* is installed at a downstream side where the oxygen-containing gas supply pipe 232*a*, the hydrogen-containing gas supply pipe 232*b*, and the inert gas supply pipe 232*c* are joined, and is connected to an upstream end of the gas inlet 234. While adjusting flow rates of the respective gases by the MFCs 252*a*, 252*b*, and 252*c* by opening/closing the valves 253*a*, 253*b*, 253*c*, and 243*a*, process gases such as the oxygen-containing gas, the hydrogen-containing gas, the inert gas, and the like can be supplied into the process chamber 201 through the gas supply pipes 232*a*, 232*b*, and 232*c*.

A gas supply part (gas supply system) according to the present embodiment mainly includes the gas supply head 236 (the lid 233, the gas inlet 234, the buffer chamber 237, the opening 238, the shielding plate 240, and the gas outlet 239), the oxygen-containing gas supply pipe 232*a*, the hydrogen-containing gas supply pipe 232*b*, the inert gas supply pipe 232*c*, the MFCs 252*a*, 252*b*, and 252*c*, and the valves 253*a*, 253*b*, 253*c*, and 243*a*.

In addition, an oxygen-containing gas supply system according to the present embodiment includes the gas supply head 236, the oxygen-containing gas supply pipe 232*a*, the MFC 252*a*, and the valves 253*a* and 243*a*. In addition, a hydrogen gas supply system according to the present embodiment includes the gas supply head 236, the hydrogen-containing gas supply pipe 232*b*, the MFC 252*b*, and the valves 253*b* and 243*a*. Further, an inert gas supply system according to the present embodiment includes the gas supply head 236, the inert gas supply pipe 232*c*, the MFC 252*c*, and the valves 253*c* and 243*a*.

The substrate processing apparatus 100 according to the present embodiment is configured to perform an oxidation process by supplying an $O_2$ gas as an oxygen-containing gas from the oxygen-containing gas supply system. However, a nitrogen-containing gas supply system configured to supply a nitrogen-containing gas into the process chamber 201 may be installed instead of the oxygen-containing gas supply system. According to the processing apparatus configured as above, a nitridation process can be performed instead of the oxidation process of the substrate. In this case, for example, an $N_2$ gas supply source as a nitrogen-containing gas supply source is installed instead of the $O_2$ gas supply source 250a, and the oxygen-containing gas supply pipe 232a is configured as a nitrogen-containing gas supply pipe.

(Exhaust Part)

A gas exhaust port 235 configured to exhaust the reaction gas from the interior of the process chamber 201 is installed at the side wall of the lower container 211. An upstream end of a gas exhaust pipe 231 is connected to the gas exhaust port 235. An APC (Auto Pressure Controller) valve 242 as a pressure regulator (pressure regulating part), a valve 243b as an opening/closing valve, and a vacuum pump 246 as a vacuum exhaust device are installed at the gas exhaust pipe 231 in sequence from the upstream side.

An exhaust part according to the present embodiment mainly includes the gas exhaust port 235, the gas exhaust pipe 231, the APC vale 242, and the valve 243b. The vacuum pump 246 may be included in the exhaust part.

(Plasma Generation Part)

A spiral coil electrode (hereinafter also referred to as a "resonance coil") 212 is installed on an outer peripheral portion of the process chamber 201, that is, outside a side wall of the upper container 210, to surround the process chamber 201. An RF sensor 272, a high-frequency power supply 273, and a matching device 274 configured to match the impedance and output frequency of the high-frequency power supply 273 are connected to the resonance coil 212.

The high-frequency power supply 273 is configured to supply high-frequency power (RF power) to the resonance coil 212. The RF sensor 272 is installed at an output side of the high-frequency power supply 273 and is configured to monitor information of high-frequency traveling wave and reflected wave supplied. The reflected wave power monitored by the RF sensor 272 is input to the matching device 274. The matching device 274 controls the impedance of the high-frequency power supply 273 and the frequency of the output high-frequency power based on the information of the reflected wave input from the RF sensor 272 so that the reflected wave is minimized.

The high-frequency power supply 273 includes a power supply control means (control circuit) including a high-frequency oscillation circuit and a preamplifier configured to define an oscillation frequency and an output, respectively, and an amplifier (output circuit) configured to amplify the output to a predetermined output. The power supply control means controls the amplifier based on output conditions related to a frequency and a power preset via an operation panel. The amplifier supplies constant high-frequency power to the resonance coil 212 via a transmission line.

The resonance coil 212 is spirally wound around the process chamber 201 to extend along a vertical direction of the process chamber 201 (that is, a moving direction of the susceptor 217). Since the resonance coil 212 wound spirally forms a standing wave having a predetermined wavelength, a winding diameter, a winding pitch, and the number of turns are set to resonate at a constant wavelength. That is, an electrical length of the resonance coil 212 is set to a length corresponding to an integer multiple (one time, two times, and the like) of one wavelength at a predetermined frequency of the high-frequency power supplied from the high-frequency power supply 273.

Specifically, in consideration of an applied power, an intensity of a generated magnetic field, an outer shape of a device to be applied, and the like, the resonance coil 212 has an effective sectional area of 50 to 300 mm and a coil diameter of 200 to 500 mm such that a magnetic field of about 0.01 to 10 Gauss may be generated by high-frequency power of 800 kHz to 50 MHz and 0.5 to 5 KW, for example, and is wound about 2 to 60 times around an outer periphery of a room forming the plasma generation space 201a.

For example, the length of one wavelength may be about 22 meters when the frequency is 13.56 MHz, the length of one wavelength may be about 11 meters when the frequency is 27.12 MHz, and the electrical length of the resonance coil 212 may be equal to (one time) the length of the one wavelength. In the present embodiment, the frequency of the high-frequency power is set to 27.12 MHz, and the electrical length of the resonance coil 212 is set to the length (about 11 meters) of one wavelength. The winding pitch of the resonance coil 212 is set, for example, at equal intervals of 24.5 mm. Further, the winding diameter (a diameter) of the resonance coil 212 is set to be larger than a diameter of the wafer 200. In the present embodiment, the diameter of the wafer 200 is set to 300 mm, and the winding diameter of the resonance coil 212 is set to be 500 mm, which is larger than the diameter of the wafer 200.

The material of the resonance coil 212 may include a copper pipe, a copper thin plate, an aluminum pipe, an aluminum thin plate, a material obtained by depositing copper or aluminum on a polymer belt, or the like. The resonance coil 212 is formed of an insulating material in a flat plate shape, and is supported by a plurality of supports (not shown) vertically installed on the upper end surface of a base plate 248.

Both ends of the resonance coil 212 are electrically grounded, and at least one end thereof is grounded via a movable tap 213 to finely adjust the electrical length of the resonance coil at the time of initial installation of the apparatus or at the time of changing process conditions. Reference numeral 214 in FIG. 1 denotes the other fixed ground. A position of the movable tap 213 is adjusted such that the resonance characteristics of the resonance coil 212 are substantially equal to those of the high-frequency power supply 273. Further, a power feeder is formed by a movable tap 215 between the grounded both ends of the resonance coil 212 such that the impedance of the resonance coil 212 is finely adjusted at the time of initial installation of the apparatus or at the time of change of process conditions. In this way, since the resonance coil 212 includes a variable ground and a variable power feeder, the resonance frequency and a load impedance of the process chamber 201 can be adjusted more easily, as will be described later.

Further, a waveform adjustment circuit (not shown) including a coil and a shield is inserted in one end (or the other end or both ends) of the resonance coil 212 such that a phase current and an anti-phase current flow symmetrically with respect to an electrical midpoint of the resonance coil 212. The waveform adjustment circuit forms an open circuit by setting the ends of the resonance coil 212 to an electrically disconnected state or an electrically equivalent state. The end of the resonance coil 212 may be non-grounded by a choke series resistor and may be DC-connected to a fixed reference potential.

A shielding plate 223 is installed to shield an outer electric field of the resonance coil 212 and to form a capacitance component (C component), which may be used to form a resonance circuit between the shielding plate 223 and the resonance coil 212. The shielding plate 223 is generally made of a conductive material such as an aluminum alloy and is formed in a cylindrical shape. The shielding plate 223 is disposed at a distance of about 5 to 150 mm from the outer periphery of the resonance coil 212. Although the shielding plate 223 is usually grounded such that its potential is equal to potentials of both ends of the resonance coil 212, one end or both ends of the shielding plate 223 are configured such that a tap position can be adjusted to accurately set a resonance number of the resonance coil 212. Alternatively, a trimming capacitance may be inserted between the resonance coil 212 and the shielding plate 223 to accurately set the resonance number.

A plasma generation part according to the present embodiment mainly includes the resonance coil 212, the RF sensor 272, and the matching device 274. The high-frequency power supply 273 may be included in the plasma generation part.

Figure 2:
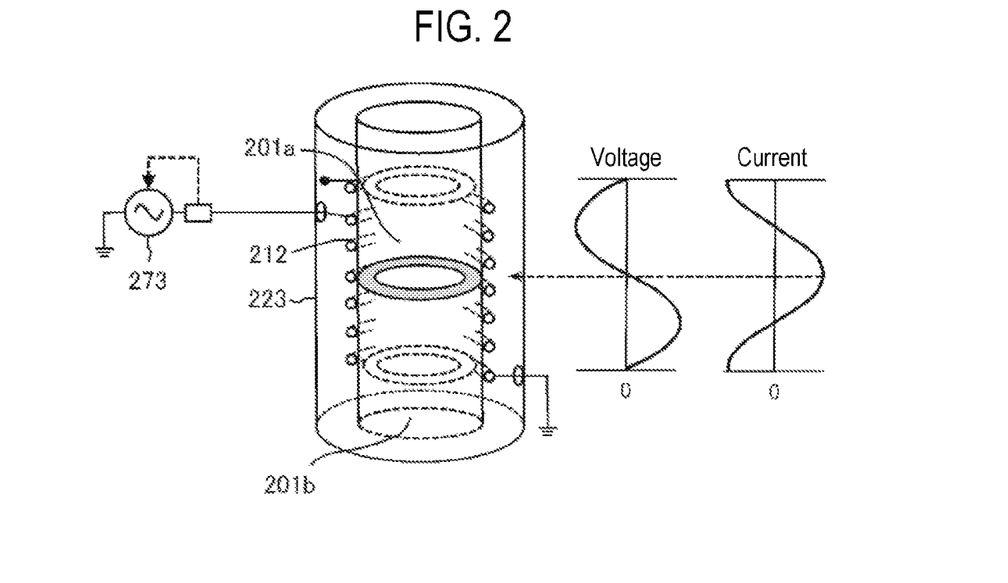
FIG. 2 is an explanatory view for explaining plasma generation principle of a substrate processing apparatus according to an embodiment of the present disclosure.

Here, plasma generation principle of the apparatus according to the present embodiment and properties of the generated plasma will be described with reference to FIG. 2. FIG. 2 is an explanatory view that explains the plasma generation principle of the substrate processing apparatus according to the present embodiment.

The plasma generation circuit including the resonance coil 212 is constituted by an RLC parallel resonance circuit. When the wavelength of the high-frequency power supplied from the high-frequency power supply 273 is equal to the electrical length of the resonance coil 212, the resonance condition of the resonance coil 212 is that a reactance component formed by a capacitance component and an induction component of the resonance coil 212 is canceled out and a pure resistance is obtained. However, in the above-described plasma generation circuit, when plasma is generated, an actual resonance frequency fluctuates slightly depending on fluctuation in capacitive coupling between a voltage part of the resonance coil 212 and the plasma, fluctuation in inductive coupling between the plasma generation space 201a and the plasma, an excited state of the plasma, and the like.

Therefore, in the present embodiment, the power of the reflected wave from the resonance coil 212 when the plasma is generated is detected by the RF sensor 272, and the matching device 274 has a function of correcting the output of the high-frequency power supply 273 based on the detected power of the reflected wave such that deviation of resonance in the resonance coil 212 is compensated at the side of the power supply when the plasma is generated.

Specifically, based on the power of the reflected wave from the resonance coil 212, detected by the RF sensor 272 when the plasma is generated, the matching device 274 increases or decreases the impedance or the output frequency of the high-frequency power supply 273 such that the power of the reflected wave is minimized. When controlling the impedance, the matching device 274 is constituted by a variable capacitor control circuit that corrects preset impedance. When controlling the frequency, the matching device 274 is constituted by a frequency control circuit that corrects a preset oscillation frequency of the high-frequency power supply 273. The high-frequency power supply 273 and the matching device 274 may be integrated.

With this configuration, in the resonance coil 212 according to the present embodiment, as shown in FIG. 2, since the high-frequency power by the actual resonance frequency of the resonance coil including the plasma is supplied (or since the high-frequency power is supplied to match the actual impedance of the resonance coil including the plasma), a standing wave in which a phase voltage and an anti-phase voltage are always canceled out is formed. When the electrical length of the resonance coil 212 is equal to the wavelength of the high-frequency power, the highest phase current is generated at the electrical midpoint of the coil (a node where the voltage is zero). Therefore, in the vicinity of the electrical midpoint, there is almost no capacitive coupling with the wall of the process chamber and the susceptor 217, and doughnut-shaped induction plasma having an extremely low electric potential is formed.

(Control Part)

As shown in FIG. 1, a processing apparatus 100 according to the present embodiment includes the controller 221 as a control part (control means).

The controller 221 is configured to control the APC valve 242, the valve 243b, and the vacuum pump 246 via a signal line A, control the susceptor elevating mechanism 268 via a signal line B, control a heater power adjustment mechanism 276 and the variable impedance mechanism 275 via a signal line C, control the gate valve 244 via a signal line D, control the RF sensor 272, the high-frequency power supply 273, and the matching device 274 via a signal line E, and control the MFCs 252a to 252c and the valves 253a to 253c and 243a via a signal line F, respectively.

Figure 3:
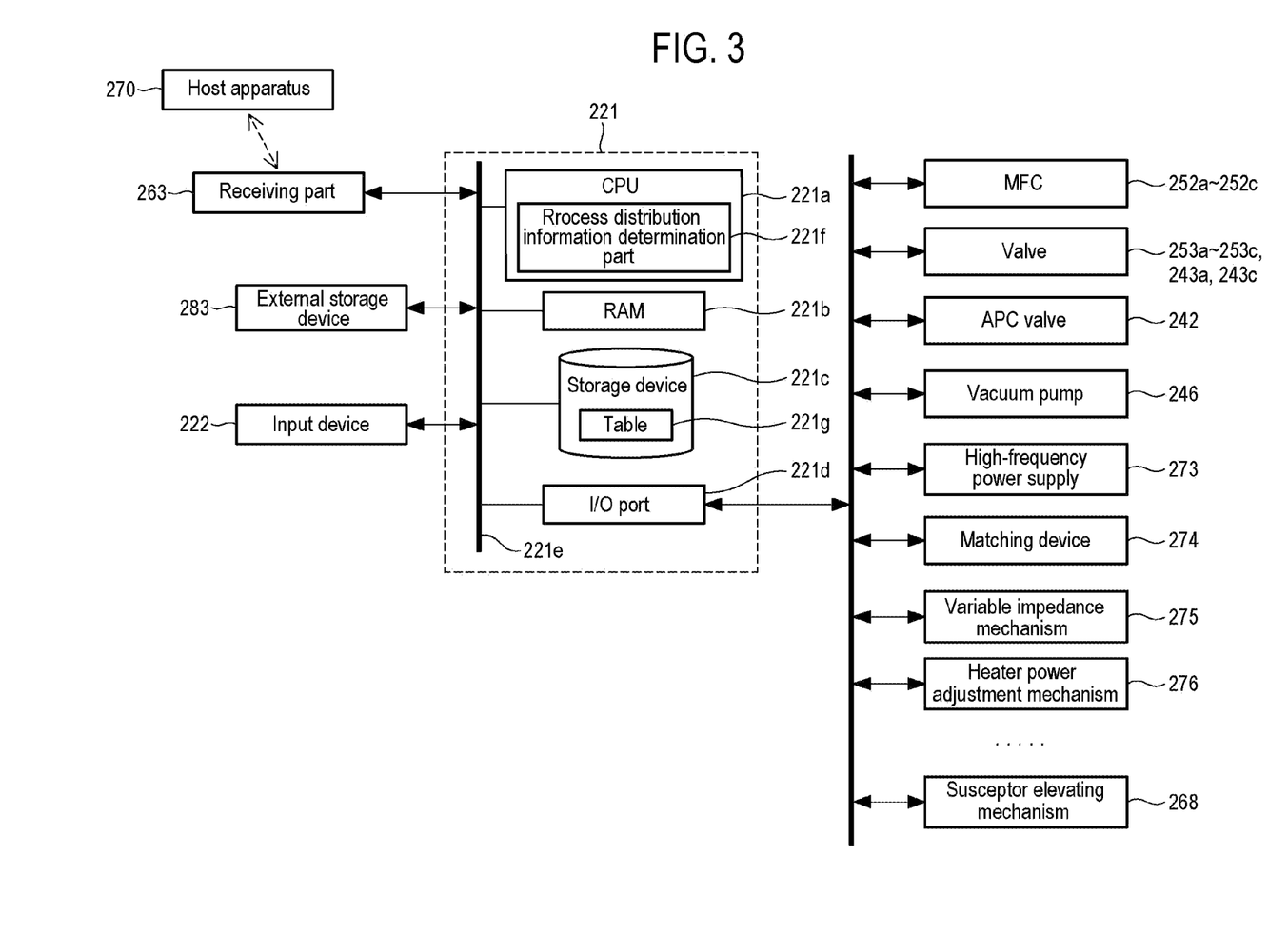
FIG. 3 is a block diagram showing a configuration example of a controller of a substrate processing apparatus according to an embodiment of the present disclosure.

Here, a configuration of the controller 221 will be described in more detail. FIG. 3 is a block diagram showing a configuration example of the controller of the substrate processing apparatus according to the present embodiment.

As shown in FIG. 3, the controller 221 is configured as a computer including a central processing unit (CPU) 221a, a random access memory (RAM) 221b, a storage device 221c, and an I/O port 221d. The RAM 221b, the storage device 221c, and the I/O port 221d are configured to be capable of exchanging data with the CPU 221a via an internal bus 221e. An input/output device 222 configured as, for example, a touch panel, a display, or the like, and an external storage device 283 are connected to the controller 221. Further, the controller 221 is configured to be connectable to a host apparatus (host computer) 270, which is a higher-level apparatus of the processing apparatus 100, via a receiving part 263. The "connection" in the present disclosure not only means that the respective parts are connected by a physical cable (signal line), but also means that signals (electronic data) of the respective parts can be directly or indirectly transmitted/received.

The storage device 221c includes, for example, a flash memory, a hard disk drive (HDD), or the like. A control program that controls the operation of the substrate processing apparatus, process recipes in which procedures and conditions of substrate processing to be described later, and the like are readably stored in the storage device 221c. The process recipes are combined to obtain a predetermined result by causing the controller 221 to execute the respective procedures in the substrate processing process to be described later, and function as a program. Hereinafter, the process recipes and the control program are collectively referred to simply as a program. In the present disclosure, the term "program" may include only a program recipe, only a control program, or both. Further, the RAM 221b is configured as a memory area (work area) in which programs, data, and the like read by the CPU 221a are temporarily held.

The I/O port 221d is connected to the MFCs 252a to 252c, the valves 253a to 253c, 243a, and 243b, the gate valve 244, the APC valve 242, the vacuum pump 246, the RF sensor 272, the high-frequency power supply 273, the matching device 274, the susceptor elevating mechanism 268, the variable impedance mechanism 275, the heater power adjustment mechanism 276, and the like.

The CPU 221a is configured to read and execute the control program from the storage device 221c and to read the process recipes from the storage device 221c in response to an input of an operation command from the input/output device 222, and the like. Then, the CPU 221a is configured to be capable of controlling an opening degree adjusting operation of the APC valve 242, an opening/closing operation of the valve 243b, and a start/stop of the vacuum pump 246 via the I/O port 221d and the signal line A, controlling an elevating operation of the susceptor elevating mechanism 268 via the signal line B, controlling an adjusting operation of an amount of power supplied to the heater 217b (a temperature adjusting operation) by the heater power adjustment mechanism 276 and an impedance value adjusting operation by the variable impedance mechanism 275 via the signal line C, controlling an opening/closing operation of the gate valve 244 via the signal line D, controlling operations of the RF sensor 272, the matching device 274, and the high-frequency power supply 273 via the signal line E, and controlling a flow rate adjusting operation of various gases by the MFCs 252a to 252c and an opening/closing operation of the valves 253a to 253c and 243a via the signal line F, and so on according to the contents of the read process recipes.

The CPU 221a also functions as a process distribution information determination part 221f by executing the control program read from the storage device 221c. The process distribution information determination part 221f is configured to set a height position of the wafer 200 to be processed according to process distribution information to be described in detail later, and to notify the susceptor elevating mechanism 268 of the setting result. The process distribution information determination part 221f uses a table 221g in the storage device 221c to set such a height position. That is, the table 221g in which a relationship between the process distribution information and the control value of the susceptor elevating mechanism 268 is recorded is registered in the storage device 221c.

The controller 221 can be configured by installing, in a computer, the above-mentioned program stored in an external storage device (for example, a magnetic tape, a magnetic disk such as a flexible disk or a hard disk, an optical disk such as a CD or a DVD, a magneto-optical disk such as an MO, or a semiconductor memory such as a USB memory or a memory card) 223. The storage device 221c and the external storage device 283 are configured as a computer-readable recording medium. Hereinafter, these are collectively referred to simply as a recording medium. In the present disclosure, when the term "recording medium" is used, it may include the storage device 221c alone, the external storage device 283 alone, or both. A communication means such as the Internet or a dedicated line may be used to supply the program to the computer without using the external storage device 283.

(2) Substrate Processing Process

Figure 4:
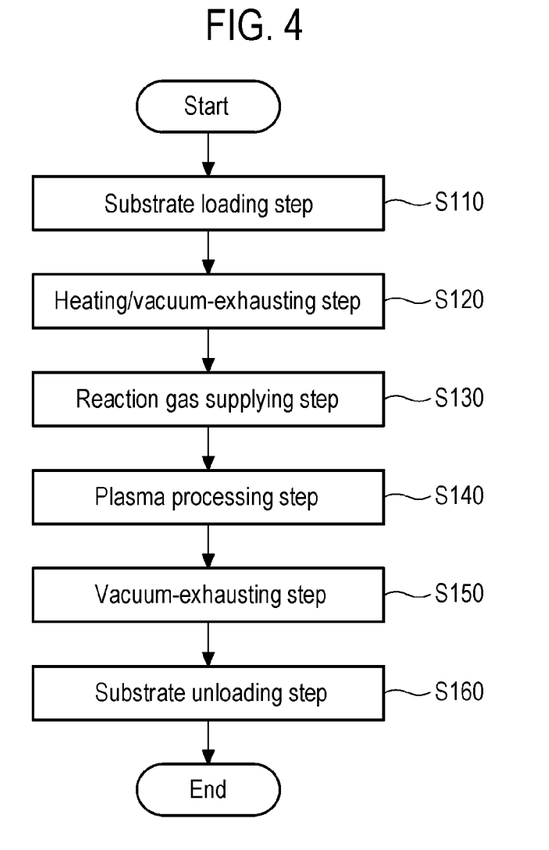
FIG. 4 is a flow chart showing an outline of a procedure of a substrate processing process according to an embodiment of the present disclosure.
Figure 5:
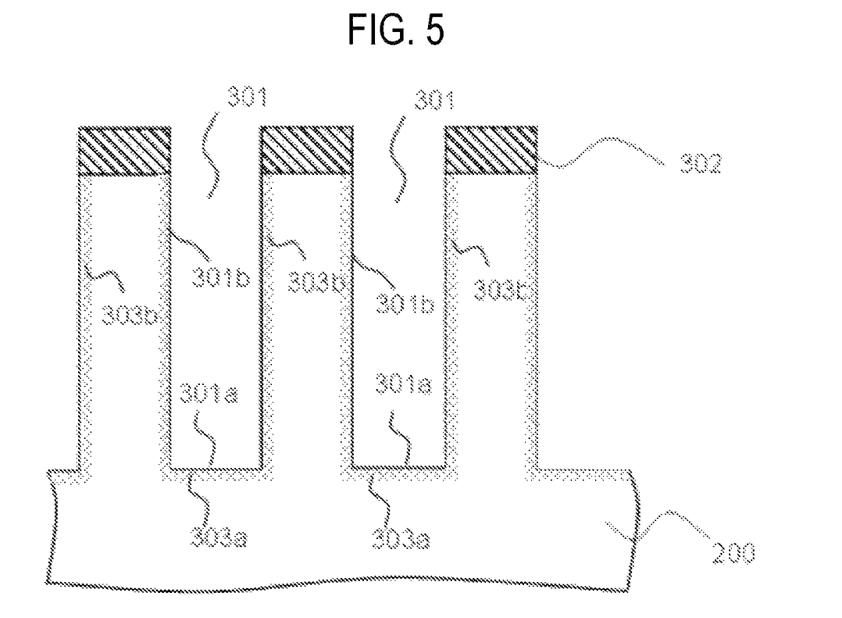
FIG. 5 is an explanatory view showing an example of a substrate in which grooves (trenches) are formed, which are processed in a substrate processing process according to an embodiment of the present disclosure.

Next, a substrate processing process according to the present embodiment will be mainly described with reference to FIG. 4. FIG. 4 is a flow chart showing an outline of the procedure of the substrate processing process according to the present embodiment. FIG. 5 is an explanatory view showing an example of a substrate in which grooves (trenches) are formed, which are processed in the substrate processing process according to the present embodiment The substrate processing process according to the present embodiment is performed by the above-described processing apparatus 100, as one of processes of manufacturing a semiconductor device such as a flash memory or the like. In the following description, the operations of various parts constituting the processing apparatus 100 are controlled by the controller 221.

For example, as shown in FIG. 5, trenches 301 having at least a surface formed of a silicon layer and having an unevenness having a high aspect ratio are formed in advance on the surface of the wafer 200 to be processed in the substrate processing process according to the present embodiment. In the present embodiment, an oxidation process using plasma is performed on the silicon layer exposed on an inner wall of the trench 301. The trench 301 is formed, for example, by forming a mask layer 302 having a predetermined pattern on the wafer 200 and etching the surface of the wafer 200 to a predetermined depth using the mask layer 302.

(Substrate Loading Step S110)

First, the wafer 200 is loaded into the process chamber 201. Specifically, the susceptor elevating mechanism 268 lowers the susceptor 217 to a transfer position of the wafer 200, and causes the wafer push-up pins 266 to pass through the through-holes 217a of the susceptor 217. As a result, the wafer push-up pins 266 protrude from the surface of the susceptor 217 by a predetermined height.

Subsequently, the gate valve 244 is opened, and the wafer 200 is loaded into the process chamber 201 from a vacuum transfer chamber adjacent to the process chamber 201 by using a wafer transfer mechanism (not shown). The loaded substrate 200 is supported in a horizontal posture on the wafer push-up pins 266 protruding from the surface of the susceptor 217. When the wafer 200 is loaded into the process chamber 201, the wafer transfer mechanism is retracted outside the process chamber 201, and the gate valve 244 is closed to seal the interior of the process chamber 201. Then, the susceptor elevating mechanism 268 raises the susceptor 217, such that the substrate 200 is supported on the upper surface of the susceptor 217.

(Heating/Vacuum-Exhausting Step S120)

Subsequently, the susceptor 200 loaded into the process chamber 201 is heated. The heater 217b is heated in advance. When the susceptor 200 is held on the susceptor 217 in which the heater 217b is embedded, the wafer 200 is heated to a predetermined value within a range, for example, from 150 to 750 degrees C. In this step, the wafer 200 is heated to 600 degrees C. Further, while the wafer 200 is being heated, the interior of the process chamber 201 is vacuum-exhausted by the vacuum pump 246 via the gas exhaust pipe 231 to set the internal pressure of the process chamber 201 to a predetermined value. The vacuum pump 246 is operated at least until a substrate unloading step S160 to be described later is ended.

(Reaction Gas Supplying Step S130)

Subsequently, supply of an $O_2$ gas, which is an oxygen-containing gas, and a $H_2$ gas, which is a hydrogen-containing gas, as reaction gases, is started. Specifically, while the valves 253a and 253b are opened and flow rates of the gases are controlled by the MFCs 252a and 252b, the supply of the $O_2$ gas and the $H_2$ gas into the process chamber 201 is started. At this time, the flow rate of the $O_2$ gas may be set to a predetermined value within a range of, for example, 20 to 2,000 sccm, specifically 20 to 1,000 sccm. Further, the flow rate of the $H_2$ gas may be set to a predetermined value within a range of, for example, 20 to 1,000 sccm, specifically 20 to 500 sccm. More specifically, a total flow rate of the $O_2$ gas and the H$_2$ gas may be set to 1,000 sccm and a flow rate ratio may be set to O$_2$/H$_2$≥950/50.

Further, the exhaust of the interior of the process chamber 201 is controlled by adjusting the opening degree of the APC valve 242 so that the interior of the process chamber 201 may be a predetermined pressure within a range of, for example, 1 to 250 Pa, specifically 50 to 200 Pa, more specifically about 150 Pa. In this way, while the interior of the process chamber 201 is appropriately exhausted, the supply of the O$_2$ gas and the H$_2$ gas is continued until a plasma processing step S140 to be described below is ended.

(Plasma Processing Step S140)

When the internal pressure of the process chamber 201 is stabilized, application of the high-frequency power from the high-frequency power supply 273 to the resonance coil 212 via the RF sensor 272 is started. In the present embodiment, the high-frequency power of 27.12 MHz is supplied from the high-frequency power supply 273 to the resonance coil 212. The high-frequency power supplied to the resonance coil 212 may be predetermined power within a range of, for example, 100 to 5,000 W, specifically 100 to 3,500 W, more specifically about 3,500 W. If the power is lower than 100 W, it is difficult to stably generate plasma discharge.

Thus, a high-frequency electric field is formed in the plasma generation space 201a into which the O$_2$ gas and the H$_2$ gas are supplied, and a doughnut-shaped induction plasma having the highest plasma density is excited by this electric field at a height position corresponding to the electrical midpoint of the resonance coil 212 in the plasma generation space. The O$_2$ gas and the H$_2$ gas in the form of plasma are dissociated to generate reactive species such as oxygen radicals containing oxygen (oxygen active species), oxygen ions, hydrogen radicals containing hydrogen (hydrogen active species), hydrogen ions, and the like.

As described above, when the electrical length of the resonance coil 212 is equal to the wavelength of the high-frequency power, since there is almost no capacitive coupling with the process chamber wall and a substrate mounting stand in the vicinity of the electrical length of the resonance coil 212 in the plasma generation space 201a, a doughnut-shaped induction plasma having an extremely low electrical potential is excited. Since the plasma having extremely low electric potential is generated, generation of a sheath on the wall of the plasma generation space 201a or on the susceptor 217 can be prevented. Therefore, in present embodiment, ions in the plasma are not accelerated.

The radicals generated by the induction plasma and the ions in a non-accelerated state are uniformly supplied into grooves 301 in the wafer 200 held on the susceptor 217 in the substrate process space 201b. The supplied radicals and ions uniformly react with the side walls 301a and 301b to modify the silicon layer on the surface into a silicon oxide layer having good step coverage.

In addition, since acceleration of ions is prevented, the wafer 200 can be prevented from being damaged by the accelerated ions, and a sputtering effect on a peripheral wall of the plasma generation space can be suppressed to prevent damage to the peripheral wall of the plasma generation space 201a.

In addition, since the matching device 274 attached to the high-frequency power supply 273 compensates for the power of the reflected wave due to impedance mismatch generated in the resonance coil 212 at the side of the high-frequency power supply 273 to supplement a decrease in an effective load power, an initial level of high-frequency power can always be reliably supplied to the resonance coil 212 to stabilize the plasma. Therefore, the wafer 200 held in the substrate process space 201b can be uniformly processed at a constant rate.

Thereafter, when a predetermined processing time, for example, 10 to 300 seconds, elapses, the output of the power from the high-frequency power supply 273 is stopped and the plasma discharge in the process chamber 201 is stopped. In addition, the valves 253a and 253b are closed to stop the supply of the O$_2$ gas and the H$_2$ gas into the process chamber 201. Thus, the plasma processing step S140 is ended.

(Vacuum-Exhausting Step S150)

When the supply of the O$_2$ gas and the H$_2$ gas is stopped, the interior of the process chamber 201 is vacuum-exhausted via the gas exhaust pipe 231. Thus, the O$_2$ gas and the H$_2$ gas in the process chamber 201, the exhaust gas generated by reaction of these gases, and the like are exhausted to the outside of the process chamber 201. After that, the opening degree of the APC valve 242 is adjusted to adjust the internal pressure of the process chamber 201 to the same pressure (for example, 100 Pa) as that of the vacuum transfer chamber (an unloading destination of the wafer 200) (not shown) adjacent to the process chamber 201.

(Substrate Unloading Step S160)

When the internal pressure of the process chamber 201 reaches a predetermined pressure, the susceptor 217 is lowered to a transfer position of the wafer 200, and the wafer 200 is supported on the wafer push-up pins 266. Then, the gate valve 244 is opened, and the wafer 200 is unloaded from the process chamber 201 by using the wafer transfer mechanism. Thus, the substrate processing process according to the present embodiment is completed.

An example in which the O$_2$ gas and the H$_2$ gas are plasma-excited to perform the plasma processing on the substrate has been illustrated in the present embodiment. However, the present disclosure is not limited thereto. For example, instead of the O$_2$ gas, an N$_2$ gas may be supplied into the process chamber 201, and the N$_2$ gas and the H$_2$ gas may be plasma-excited to perform a nitridation process on the substrate. In this case, the processing apparatus 100 including the above-described nitrogen-containing gas supply system instead of the above-described oxygen-containing gas supply system can be used.

(3) Control Process Procedure

Next, the procedure of a control process performed by the controller 221 in the above-described substrate processing process will be described with a specific example. Here, in particular, a control process when the substrate processing is performed on the wafer 200 using the plasma generated in the plasma generation space 201a in the plasma processing step S140 will be given as a specific example.

(Processing Target Wafer)

The wafer 200 to be processed in the above-described substrate processing process has been subjected to a predetermined process on the surface thereof, for example, the trenches 301 are formed in advance (see FIG. 5). In that case, in-plane variation may occur in the process distribution of the predetermined process in the wafer 200. Specifically, the inner peripheral side and the outer peripheral side of the wafer 200 may have different processing states (for example, surface states) after the predetermined process.

Figure 6:
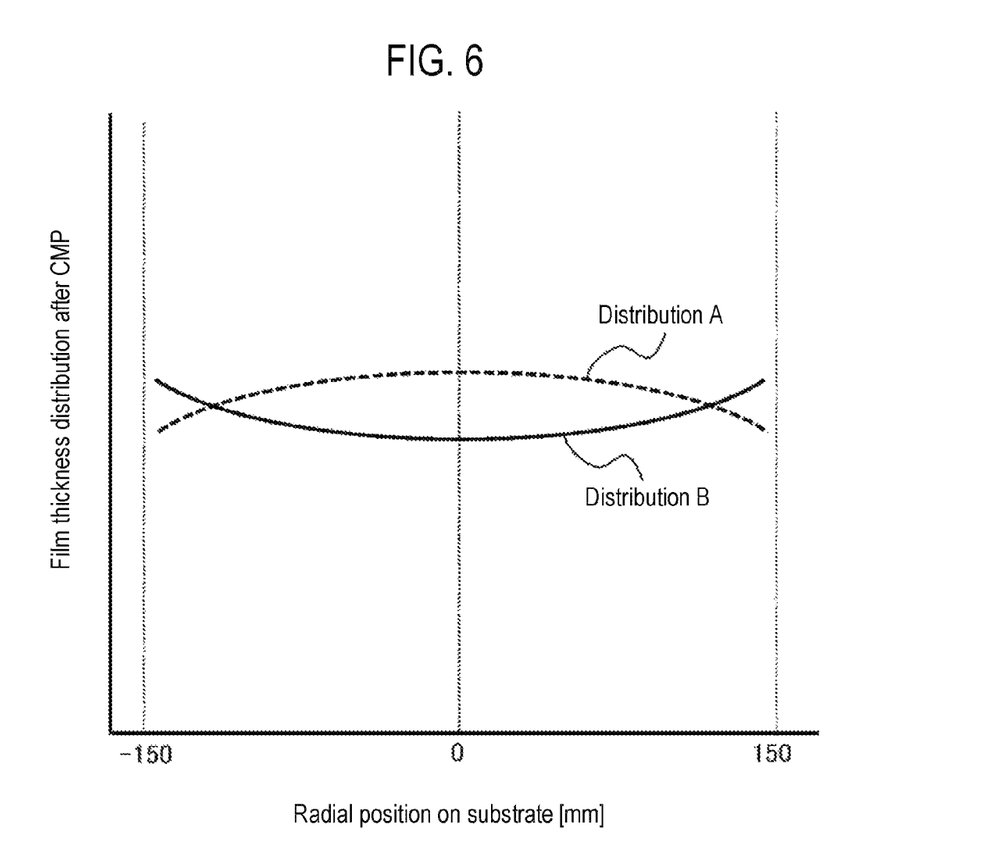
FIG. 6 is an explanatory view showing an example of in-plane variation of a substrate surface to be processed in a substrate processing process according to an embodiment of the present disclosure.

For example, as an example in which the in-plane variation of the process distribution is described easily, a case in which the surface of the silicon layer formed on the wafer 200 is subjected to chemical mechanical polishing (hereinafter, abbreviated as "CMP") may be considered. FIG. 6 is an explanatory view showing an example of in-plane variation of the substrate surface to be processed in the substrate processing process according to the present embodiment. For example, when the CMP is performed on the silicon layer on the wafer 200, in-plane variation may occur in the film thickness distribution after the CMP, as shown in FIG. 6. Specifically, for example, like a distribution A shown in the figure, a film thickness distribution with a convex cross-section may be formed such that the inner peripheral side of the wafer 200 is thicker and the outer peripheral side thereof is thinner. Alternatively, like a distribution B shown in the figure, a film thickness distribution with a concave cross-section may be formed such that the inner peripheral side of the wafer 200 is thinner and the outer peripheral side thereof is thicker.

If such an in-plane variation occurs, results of the subsequent processes may be adversely affected, for example, a width of the trench 301 may differ between the inner peripheral side and the outer peripheral side, which may cause a reduction in a yield of a semiconductor device manufacture.

Based on this, in the present embodiment, the controller 221 performs a control process to be described below in the substrate processing process.

(Acquisition of Process Distribution Information)

Prior to the substrate processing process, the wafer 200 to be processed is transferred to a measuring device (not shown), and a state of a surface process distribution is measured by the measuring device. Thus, process distribution information in which a measurement result of the state of the surface process distribution of the wafer 200 to be processed is converted into data is specified. The measuring device is not particularly limited but may be one configured by using a known technique as long as it can specify the process distribution information.

The process distribution information, which is the measurement result of the measuring device, is transmitted from the measuring device to a host apparatus 270, which is an upper-level apparatus of the processing apparatus 100. After that, the process distribution information is transmitted from the host apparatus 270 to the controller 221 via the receiving part 263 by the time the processing apparatus 100 starts the plasma processing step S140. That is, the controller 221 obtains the process distribution information on the wafer 200 to be processed via the receiving part 263 before starting the plasma processing step S140.

The case where the receiving part 263 receives the process distribution information via the host apparatus 270 has been described here as an example, but the present disclosure is not necessarily limited thereto. For example, an apparatus manager may receive a recording medium on which the process distribution information is recorded, and may cause the controller 221 to read the process distribution information. Alternatively, the apparatus manager may visually recognize the process distribution information and may input the process distribution information to the controller 221. That is, an acquisition route of the process distribution information is not particularly limited as long as it can be used by the controller 221.

(Control Procedure During Plasma Processing)

After obtaining the process distribution information, the plasma processing step S140 is started. In the plasma processing step S140, according to the process distribution information, the elevating operation of the susceptor 217 by the susceptor elevating mechanism 268 is controlled to vary a distance between the wafer 200 to be processed (that is, the wafer 200 held on the susceptor 217) and the end portion (specifically, the lower end) of the resonance coil 212 configured to generate the plasma.

In the case of plasma generation using the resonance coil 212, high density plasma (ring-shaped plasma) is generated in a portion near the resonance coil 212, as shown in FIG. 2 (see a gray portion in the figure). Further, if a distance between the lower end of the resonance coil 212 (that is, the lower end of the plasma generation space 201a) and the wafer 200 on the susceptor 217 located below the lower end is short, the wafer 200 is processed by the plasma having a high energy. On the contrary, if the distance between the lower end of the resonance coil 212 and the wafer 200 on the susceptor 217 is long, the plasma is deactivated, and the wafer 200 is processed by the plasma having a relatively low energy. The elevation control of the susceptor 217 in the plasma processing step S140 utilizes such a property.

(In Case of Convex Process Distribution)

Here, for example, as shown in FIG. 6, a case where the received process distribution information about the wafer 200 to be processed is information of a convex process distribution (see a distribution A in the figure) may be considered. In that case, first, a slope of the convex process distribution (that is, a ratio of a difference between the inner peripheral side and the outer peripheral side) is compared with a predetermined threshold value. The predetermined threshold value is recorded in advance in a table 221g of the storage device 221c.

The predetermined threshold value recorded in the table 221g may be set as a specific numerical value or may be set to correspond to a certain numerical value range. Further, here, a case where one threshold value is set as the predetermined threshold value and a process distribution information determination part 221f determines a magnitude relationship with the threshold value is taken as an example, but the present disclosure is not limited thereto. That is, a plurality of threshold values may be set as the predetermined threshold value in the table 221g. When the plurality of threshold values are set, the elevating operation of the susceptor 217 by the susceptor elevating mechanism 268 may be controlled such that the wafer 200 is positioned at a plurality of different heights (distances), for example, according to the respective threshold values.

As a result of the comparison with the predetermined threshold value, when the slope of the process distribution matches the predetermined threshold value, the elevating operation of the susceptor 217 by the susceptor elevating mechanism 268 is controlled such that the distance between the lower end of the resonance coil 212 and the wafer 200 on the susceptor 217 becomes a predetermined distance. Further, when the slope of the process distribution is larger than the predetermined threshold value, the elevating operation of the susceptor 217 by the susceptor elevating mechanism 268 is controlled such that the distance between the wafer 200 and the lower end of the resonance coil 212 are becomes smaller than the predetermined distance. Thus, especially the outer peripheral side of the wafer 200 is processed by the plasma having high energy, such that a tendency to correct the slope becomes relatively strong. Further, when the slope of the process distribution is smaller than the predetermined threshold value, the elevating operation of the susceptor 217 by the susceptor elevating mechanism 268 is controlled such that the distance between the wafer 200 and the lower end of the resonance coil 212 becomes larger than the predetermined distance. This deactivates the plasma and causes the wafer 200 to be processed by the plasma having the relatively low energy, such that the tendency to correct the slope becomes relatively weak That is, when the process distribution information is the information of the convex process distribution, in principle, while adjusting the distance between the wafer 200 and the lower end of the resonance coil 212 to a predetermined distance, the wafer 200 is moved closer to the lower end of the resonance coil 212 or is moved away from the lower end of the resonance coil 212 depending on the slope of the process distribution. In this way, by controlling the distance between the wafer 200 and the lower end of the resonance coil 212, even if a convex process distribution is generated on the wafer 200 to be processed, the plasma processing may be performed on the wafer 200 such that the process distribution is uniformly corrected.

(In Case of Concave Process Distribution)

The received process distribution information about the wafer 200 to be processed may include a concave process distribution (see a distribution B in FIG. 6) in addition to the above-described convex process distribution. That is, the wafer 200 having the convex process distribution is not necessarily loaded in.

Therefore, for example, as shown in FIG. 6, a case where the received process distribution information about the wafer 200 to be processed is the information of the concave process distribution (see the distribution B in the figure) may be considered. When the process distribution information is a convex process distribution, as described above, the distance between the wafer 200 and the lower end of the resonance coil 212 is set to the predetermined distance in principle. In contrast, when the process distribution information is the concave process distribution, the distance between the wafer 200 and the lower end of the resonance coil 212 is set to be larger than the predetermined distance in the case of the convex process distribution. Then, the elevating operation of the susceptor 217 by the susceptor elevating mechanism 268 is controlled to reach the set distance.

In this way, in the case where the process distribution information is the concave process distribution, the wafer 200 is moved away from the resonance coil 212 as compared with the case of the convex process distribution. Therefore, when the distance between the wafer 200 and the resonance coil 212 is short, an influence of the ring-shaped plasma by the resonance coil 212 becomes strong, but by moving the wafer 200 away from the ring-shaped plasma, the influence of the ring-shaped plasma may be reduced and, at the same time, an influence of diffusion may be made dominant.

Therefore, by controlling the distance between the wafer 200 and the lower end of the resonance coil 212, even when the concave process distribution is generated on the wafer 200 to be processed, the plasma processing may be performed on the wafer 200 such that the process distribution is uniformly corrected.

(Variable Control During Plasma Processing)

The elevation control of the susceptor 217 may be performed during plasma processing on the wafer 200, regardless of whether the process distribution information is a convex process distribution or a concave process distribution. That is, the distance between the wafer 200 and the lower end of the resonance coil 212 may be varied while the resonance coil 212 is generating plasma in the plasma generation space 201a.

Specifically, for example, a case where the processing distribution information is a convex process distribution and the slope thereof is larger than a predetermined threshold value may be considered. In such a case, at the beginning of plasma processing, the wafer 200 is brought close to the lower end of the resonance coil 212 as described above. Then, in the subsequent plasma processing process, a control may be performed such that the wafer 200 is moved away from the lower end of the resonance coil 212 after the processing time has elapsed as much as the slope is assumed to have decreased.

In this way, when the elevation control of the susceptor 217 is performed during the plasma processing, it is possible to vary the distance between the wafer 200 and the lower end of the resonance coil 212 according to the progress of the plasma processing. Therefore, it becomes possible to realize a control process that can cope with a wide range of processes, which may correct the process distribution on the wafer 200 more appropriately and quickly.

(Stabilization of Plasma)

It is necessary to generate stable plasma in the plasma generation space 201a to ensure the operation and effects obtained by varying the distance between the wafer 200 and the lower end of the resonance coil 212.

Therefore, in the present embodiment, the resonance coil 212 is wound to extend along the moving direction of the susceptor 217 (that is, the vertical direction of the process chamber 201). The electrical length (that is, the coil length) of the resonance coil 212 is the same as the wavelength of the high-frequency power supplied from the high-frequency power supply 273 or is an integer multiple of one wavelength of the high-frequency power.

Thus, since the generated plasma can be stabilized in the plasma generation space 201a, the wafer 200 held by the susceptor 217 can be uniformly processed at a constant rate. In this way, when the stable plasma can be generated, it is possible to ensure the operation and effects obtained by varying the distance between the wafer 200 and the lower end of the resonance coil 212. As a result, the substrate processing using the plasma may be optimized.

(4) Effects of the Present Embodiment

According to the present embodiment, one or more of the following effects are exhibited.

(a) In the present embodiment, in the plasma processing step S140, the elevating operation of the susceptor 217 by the susceptor elevating mechanism 268 is controlled such that the distance between the wafer 200 and the end portion of the resonance coil 212 is varied according to the process distribution information. Therefore, according to a state of the process distribution on the wafer 200 to be processed (for example, a state of a film distribution on the wafer surface), it is possible to perform the plasma processing on the wafer 200 such that the process distribution is uniformly corrected. That is, regarding the substrate processing performed using the plasma generated in the plasma generation space 201a, the substrate processing can be optimized according to the state of the process distribution on the wafer 200. As a result, it is possible to eliminate one of the factors that cause a reduction in the yield of semiconductor device manufacture.

(b) In the present embodiment, for example, in the case where the process distribution information is the convex process distribution, when the slope of the process distribution is larger than a predetermined threshold value, the distance between the wafer 200 and the end portion of the resonance coil 212 is made smaller than a predetermined distance. When the slope of the process distribution is smaller than the predetermined threshold value, the distance between the wafer 200 and the end portion of the resonance coil 212 is made larger than the predetermined distance. Therefore, even when the convex process distribution is generated on the wafer 200 to be processed, it is possible to perform the plasma processing on the wafer 200 such that the slope of the process distribution is uniformly corrected.

(c) In the present embodiment, for example, when the process distribution information is the convex process distribution, the distance between the wafer 200 and the end portion of the resonance coil 212 is set to be a predetermined distance. When the process distribution information is the concave process distribution, the distance between the wafer 200 and the end portion of the resonance coil 212 is set to be larger than the predetermined distance. Therefore, even when the concave process distribution is generated on the wafer 200 to be processed, it is possible to perform the plasma processing on the wafer 200 such that the process distribution is uniformly corrected.

(d) In the present embodiment, for example, while the resonance coil 212 is generating plasma in the plasma generation space 201a, the elevating operation of the susceptor 217 by the susceptor elevating mechanism 268 is controlled such that the distance between the wafer 200 and the end portion of the resonance coil 212 can be varied. Therefore, it is possible to vary the distance between the wafer 200 and the end portion of the resonance coil 212 according to the progress of the plasma processing. This makes it possible to realize a control process that can cope with a wide range of processes, which may correct the process distribution on the wafer 200 more appropriately and quickly.

(e) In the present embodiment, the resonance coil 212 is wound to extend along the moving direction of the susceptor 217, and a coil length of the resonance coil 212 is the same as the wavelength of the high-frequency power or is an integer multiple of one wavelength of the high-frequency power. Therefore, the plasma generated in the plasma generation space 201a can be stabilized such that the wafer 200 can be uniformly processed at a constant rate. In this way, when the stable plasma can be generated, it is possible to ensure the operation and effects obtained by varying the distance between the wafer 200 and the end portion of the resonance coil 212. As a result, the substrate processing performed using the plasma may be optimized.

Other Embodiments

Although the embodiments of the present disclosure has been specifically described above, the present disclosure is not limited to the above-described embodiments, but various modifications can be made without departing from the spirit and scope of the present disclosure.

In the above-described embodiments, an example of performing the oxidation process or the nitridation process on the substrate surface using plasma has been described. However, the present disclosure is not limited to these processes but can be applied to all techniques for performing a process on a substrate by using plasma. For example, the present disclosure can be applied to a film-forming process that forms a predetermined film on a substrate surface using plasma, a modifying process or a doping process on the formed film, a reducing process of an oxide film, an etching process of the film, a resist ashing process, and the like.

Further, in the above-described embodiments, an apparatus configuration in which one substrate is processed in one process chamber has been illustrated. However, the present disclosure is not limited thereto, but the apparatus may be an apparatus in which a plurality of substrates are arranged in the horizontal direction or the vertical direction. Further, the moving direction of the substrate in the process chamber is not limited to the vertical direction (elevating direction) but may be a left and right direction (horizontal direction).

Further, for example, although the semiconductor device manufacturing process has been described in the above-described embodiments, the present disclosure may be applied to other than the semiconductor device manufacturing process. For example, the present disclosure may be applied to substrate processing such as a liquid crystal device manufacturing process, a solar cell manufacturing process, a light-emitting device manufacturing process, a glass substrate processing process, a ceramic substrate processing process, a conductive substrate processing process, and the like.

<Aspects of Present Disclosure>

Hereinafter, some aspects of the present disclosure will be additionally described as supplementary notes.

(Supplementary Note 1)

According to some embodiments of the present disclosure, there is provided a substrate processing apparatus that includes: a process chamber including a plasma generation space and a process space; a coil electrode arranged around the plasma generation space; a substrate mounting table on which a substrate to be processed in the process space is mounted; an elevator configured to move the substrate mounting table in the process chamber; and a controller configured to control the elevator to vary a distance between the substrate and an end portion of the coil electrode according to process distribution information on the substrate.

(Supplementary Note 2)

In the substrate processing apparatus of Supplementary Note 1, in a case where the process distribution information is a convex process distribution, the controller is configured to set the distance between the substrate and the end portion of the coil electrode to be smaller than a predetermined distance when a slope of the process distribution is larger than a predetermined threshold value, and set the distance between the substrate and the end portion of the coil electrode to be larger than the predetermined distance when the slope of the process distribution is smaller than the predetermined threshold value.

(Supplementary Note 3)

In the substrate processing apparatus of Supplementary Note 1 or 2, the controller is further configured to set the distance between the substrate and the end portion of the coil electrode to be the predetermined distance when the process distribution information is the convex process distribution, and set the distance between the substrate and the end portion of the coil electrode to be larger than the predetermined distance when the process distribution information is a concave process distribution.

(Supplementary Note 4)

In the substrate processing apparatus of one of Supplementary Notes 1 to 3, the controller is further configured to control the elevator to vary the distance while the coil electrode is generating plasma in the plasma generation space.

(Supplementary Note 5)

In the substrate processing apparatus of one of Supplementary Notes 1 to 4, the coil electrode is wound to extend along a moving direction of the substrate mounting table.

(Supplementary Note 6)

According to some embodiments of the present disclosure, there is provided a method of manufacturing a semiconductor device, including: mounting a substrate on a substrate mounting table that is movable in a process chamber; processing the substrate in a process space in the process chamber while forming a plasma generation space in the process chamber by a coil electrode; and moving the substrate mounting table to vary a distance between the substrate and an end portion of the coil electrode according to process distribution information on the substrate.

(Supplementary Note 7)

According to some embodiments of the present disclosure, there is provided a program that causes, by a computer, a substrate processing apparatus to perform a process including: mounting a substrate on a substrate mounting table that is movable in a process chamber; processing the substrate in a process space in the process chamber while forming a plasma generation space in the process chamber by a coil electrode; and moving the substrate mounting table to vary a distance between the substrate and an end portion of the coil electrode according to process distribution information on the substrate.

(Supplementary Note 8)

According to some embodiments of the present disclosure, there is provided a recording medium storing a program that causes, by a computer, a substrate processing apparatus to perform a process including: mounting a substrate on a substrate mounting table that is movable in a process chamber; processing the substrate in a process space in the process chamber while forming a plasma generation space in the process chamber by a coil electrode; and moving the substrate mounting table to vary a distance between the substrate and an end portion of the coil electrode according to process distribution information on the substrate.

According to the present disclosure in some embodiments, it is possible to optimize substrate processing performed using plasma generated in a plasma generation space.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
   a process chamber including a plasma generation space and a process space;
   a coil electrode arranged around the plasma generation space;
   a substrate mounting table on which a substrate to be processed in the process space is mounted;
   an elevator configured to move the substrate mounting table in the process chamber; and
   a controller configured to control the elevator to vary a distance between the substrate and an end portion of the coil electrode according to process distribution information on the substrate,
   wherein in a case where the process distribution information is a convex process distribution, the controller is configured to set the distance between the substrate and the end portion of the coil electrode to be smaller than a predetermined distance when a slope of the convex process distribution is larger than a predetermined threshold value, and set the distance between the substrate and the end portion of the coil electrode to be larger than the predetermined distance when the slope of the convex process distribution is smaller than the predetermined threshold value.

2. The substrate processing apparatus of claim 1, wherein the controller is further configured to:
   set the distance between the substrate and the end portion of the coil electrode to be the predetermined distance when the process distribution information is the convex process distribution and the slope of the convex process distribution matches the predetermined threshold value, and
   set the distance between the substrate and the end portion of the coil electrode to be larger than the predetermined distance when the process distribution information is a concave process distribution.

3. The substrate processing apparatus of claim 2, wherein the controller is further configured to control the elevator to vary the distance while the coil electrode is generating plasma in the plasma generation space.

4. The substrate processing apparatus of claim 3, wherein the coil electrode is wound to extend along a moving direction of the substrate mounting table.

5. The substrate processing apparatus of claim 2, wherein the coil electrode is wound so as to extend along a moving direction of the substrate mounting table.

6. The substrate processing apparatus of claim 1, wherein the controller is further configured to control the elevator to vary the distance while the coil electrode is generating plasma in the plasma generation space.

7. The substrate processing apparatus of claim 6, wherein the coil electrode is wound to extend along a moving direction of the substrate mounting table.

8. The substrate processing apparatus of claim 1, wherein the coil electrode is wound to extend along a moving direction of the substrate mounting table.

9. A substrate processing apparatus comprising:
   a process chamber including a plasma generation space and a process space;
   a coil electrode arranged around the plasma generation space;
   a substrate mounting table on which a substrate to be processed in the process space is mounted;
   an elevator configured to move the substrate mounting table in the process chamber; and
   a controller configured to control the elevator to vary a distance between the substrate and an end portion of the coil electrode according to process distribution information on the substrate,
   wherein the controller is further configured to set the distance between the substrate and the end portion of the coil electrode to be a predetermined distance when the process distribution information is a convex process distribution, and set the distance between the substrate and the end portion of the coil electrode to be larger than the predetermined distance when the process distribution information is a concave process distribution.

10. The substrate processing apparatus of claim 9, wherein the controller is further configured to control the elevator to vary the distance while the coil electrode is generating plasma in the plasma generation space.

11. The substrate processing apparatus of claim 10, wherein the coil electrode is wound to extend along a moving direction of the substrate mounting table.

12. The substrate processing apparatus of claim 9, wherein the coil electrode is wound to extend along a moving direction of the substrate mounting table.

13. A method of manufacturing a semiconductor device, comprising:
   mounting a substrate on a substrate mounting table that is movable in a process chamber;

processing the substrate in a process space in the process chamber while forming a plasma generation space in the process chamber by a coil electrode; and moving the substrate mounting table to vary a distance between the substrate and an end portion of the coil electrode according to process distribution information on the substrate, wherein in a case where the process distribution information is a convex process distribution, the act of moving the substrate mounting table includes setting the distance between the substrate and the end portion of the coil electrode to be smaller than a predetermined distance when a slope of the convex process distribution is larger than a predetermined threshold value, and setting the distance between the substrate and the end portion of the coil electrode to be larger than the predetermined distance when the slope of the convex process distribution is smaller than the predetermined threshold value.

14. A non-transitory computer-readable storage medium storing a program that causes, by a computer, a substrate processing apparatus to perform a process comprising:

mounting a substrate on a substrate mounting table that is movable in a process chamber;

processing the substrate in a process space in the process chamber while forming a plasma generation space in the process chamber by a coil electrode; and moving the substrate mounting table to vary a distance between the substrate and an end portion of the coil electrode according to process distribution information on the substrate, wherein in a case where the process distribution information is a convex process distribution, the act of moving the substrate mounting table includes setting the distance between the substrate and the end portion of the coil electrode to be smaller than a predetermined distance when a slope of the convex process distribution is larger than a predetermined threshold value, and setting the distance between the substrate and the end portion of the coil electrode to be larger than the predetermined distance when the slope of the convex process distribution is smaller than the predetermined threshold value.

15. A method of manufacturing a semiconductor device, comprising:

mounting a substrate on a substrate mounting table that is movable in a process chamber;

processing the substrate in a process space in the process chamber while forming a plasma generation space in the process chamber by a coil electrode; and moving the substrate mounting table to vary a distance between the substrate and an end portion of the coil electrode according to process distribution information on the substrate, wherein the act of moving the substrate mounting table includes setting the distance between the substrate and the end portion of the coil electrode to be a predetermined distance when the process distribution information is a convex process distribution, and setting the distance between the substrate and the end portion of the coil electrode to be larger than the predetermined distance when the process distribution information is a concave process distribution.

16. A non-transitory computer-readable storage medium storing a program that causes, by a computer, a substrate processing apparatus to perform a process comprising:

mounting a substrate on a substrate mounting table that is movable in a process chamber;

processing the substrate in a process space in the process chamber while forming a plasma generation space in the process chamber by a coil electrode; and moving the substrate mounting table to vary a distance between the substrate and an end portion of the coil electrode according to process distribution information on the substrate, wherein the act of moving the substrate mounting table includes setting the distance between the substrate and the end portion of the coil electrode to be a predetermined distance when the process distribution information is a convex process distribution, and setting the distance between the substrate and the end portion of the coil electrode to be larger than the predetermined distance when the process distribution information is a concave process distribution.

\* \* \* \* \*